United States Patent [19]

Nobue et al.

[11] Patent Number: 4,894,700
[45] Date of Patent: Jan. 16, 1990

[54] IMAGE SENSOR

[75] Inventors: Mamoru Nobue; Sadahiro Tei, both of Ebina, Japan

[73] Assignee: Fuji Xerox Co., Ltd., Japan

[21] Appl. No.: 849,145

[22] Filed: Apr. 7, 1986

[30] Foreign Application Priority Data

| Apr. 9, 1985 [JP] | Japan | 60-74766 |
| Apr. 30, 1985 [JP] | Japan | 60-93055 |
| Jul. 17, 1985 [JP] | Japan | 60-157182 |
| Aug. 23, 1985 [JP] | Japan | 60-185282 |

[51] Int. Cl.$^4$ .......... H01L 45/00; H01J 40/14
[52] U.S. Cl. .......... 357/30; 357/2; 357/84; 250/211 J
[58] Field of Search .......... 357/30, 31, 32, 22, 357/30 H, 30 L, 30 Q

[56] References Cited

U.S. PATENT DOCUMENTS

| 4,354,104 | 10/1982 | Chikamura et al. | 357/31 |
| 4,507,519 | 3/1985 | Kazumi et al. | 357/30 Q |
| 4,626,878 | 12/1986 | Kuwano et al. | 357/19 |
| 4,650,524 | 3/1987 | Kiyama et al. | 357/30 K |
| 4,679,089 | 7/1987 | Kato | 357/30 Q |
| 4,694,317 | 9/1987 | Higashi et al. | 357/2 |
| 4,698,495 | 10/1987 | Kajiwara | 357/30 Q |
| 4,719,348 | 1/1988 | Saito et al. | 357/30 K |
| 4,727,407 | 2/1988 | Nobue et al. | 357/30 |
| 4,740,710 | 4/1988 | Arita | 357/30 |

Primary Examiner—Rolf Hille
Assistant Examiner—Robert P. Limanek
Attorney, Agent, or Firm—Welsh & Katz, Ltd.

[57] ABSTRACT

An elongated image sensor comprises a plurality of light receiving elements of a sandwich structure arranged in a row and wherein a photoconductive layer is sandwiched by a lower electrode and a light-permeable upper electrode. In the image sensor, an overlapped region of the lower and upper electrodes for each of the light receiving elements is made larger in area than a light reception region and the light reception area (sensor area) is defined by a light shielding means or an insulating film having an opening of a predetermined size.

18 Claims, 15 Drawing Sheets

IMAGE SENSOR

BACKGROUND OF THE INVENTION

1. Field of the Invention

The present invention relates to an image sensor and a method of fabricating the same.

2. Description of the Prior Art

A light receiving element of a sandwich type which uses as its photoconductive layer an amorphous semiconductor layer made of such material as hydrogenated amorphous silicon (a-Si:H) or a polycrystalline thin film made of such material as cadmium sulfide (CdS) or cadmium selenide (CdSe) exhibits an excellent photoelectric conversion characteristic, is simple in structure and easily made to provide a large light reception area. For these reasons, such elements have found wide applications to original document readers which comprises a contact type image sensor based on elongated reading elements having the same sensor section width as that of original documents. That is, the contact type image sensor is a large-area device not requiring any reduction optical system when reading documents.

However, the capacitance storage type image sensor is defective in that as the more integrated and elongated sensor is demanded, variations in electrostatic capacities between lines of a wiring section resulting from different distances of the respective light receiving elements from their sensor regions to a drive section (IC) becomes unnegligible, because such capacitance variations result in an irregular output signal of the sensor.

The sensor section of the image sensor is basically arranged so that, as shown in FIG. 18 (a) and (b) (FIG. 18 (b) is a cross-sectional view taken along line A—A in FIG. 18 (a)), a photoconductive layer 4 is sandwiched by a light permeable upper electrode 3 and a plurality of lower electrodes 2 arranged in a row on a substrate 1, which is covered with a light-shielding film c having open window a. The light receiving elements form respectively such an equivalent parallel circuit of a photodiode 5a and a capacitance 5b as shown in FIG. 19. In the contact type image sensor, a necessary number of such light receiving elements 5 are arranged on the elongated substrate in its main scanning direction at a density (for example, 16 elements/mm) necessary to resolve original document and are electrically connected through their wiring sections 6 to a drive section D. The section D comprises a power source 7, a shift register 8, and MOS field effect transistors 9 (MOSFET's) connected to the sensor sections of the light receiving elements so that driving of the shift register causes sequential switching between the sensor sections and the power source 7. When first driving of the shift register 8 causes the MOSFET's to be sequentially turned ON and OFF, a sequential closed loop is completed between the power source 7 and the respective sensor sections of the light receiving elements 5 so that electric charges resulting from the loop completion are stored in the capacitor 5b of the sensor section of the associated light receiving element itself and in a capacitor 6b of the associated wiring section 6. The stored charges are neutralized by light incident upon the associated sensor section or remain. Thereafter, second driving of the shift register 8 causes the MOSFET's to be sequentially turned ON and OFF again so that recharging of the associated capacitors 5b and 6b causes a current to flow through a signal line 10 by an amount corresponding to the remained charges in the capacitors 5b and 6b of the associated bit. Such current is outputted for every bit as a read output of the contact type image sensor. In this manner, the above-mentioned operation is repeated for every line for reading operation of the original document.

On the other hand, the wiring sections are usually formed on the same substrate 1 as the sensor sections for interconnection between the drive section D and the sensor regions. However, the sensor regions must be connected to the shift register or MOSFET by wire bonding or the like, which inevitably causes different lengths of wiring sections 6 and thus the electrostatic capacities Cx of the capacitors 6b formed by the wiring sections 6 vary.

Now, the circuit of FIG. 19 will be studied. Assuming that the capacitor 5b has an elctrostatic capacitance of Cs, the capacitor 5b is initially charged with V (a) (V (o)=$V_B$), a photocurrent Ip flows through the photodiode 5a and S is a Laplace operator. When attention is directed only to one of the light receiving elements in the circuit of FIG. 19, the equivalent circuit of the one element is as shown in FIG. 20 (a). The circuit of FIG. 20 is converted into an equivalent circuit of FIG. 20 (b) when the element is subjected to no light and into an equivalent circuit of FIG. 20 (c) when the element is subjected to light.

$V_B/S$ in FIG. 20 (b) and (c) satisfies the following relations (1) and (2) respectively.

$$V_B/S = I_B\{(1/SC_S) + (1/SC_x)\} \quad (1)$$

$$V_B/S = I_A\{1/SC_x\} + \{I_A - (I_p/S)\}/SC_S \quad (2)$$

Further, Vout(s) is given as follows.

$$V_{out}(S) = (I_A - I_B) \cdot (1/SC_x) \quad (3)$$

The equations (1) and (2) are rewritten as equations (4) and (5), respectively.

$$I_B = \{C_S C_x/(C_S + C_x)\} V_B \quad (4)$$

$$I_A = \{1/(C_S + C_x)\} \cdot \{(C_S C_x V_B) + (C_x I_p/S^2)\} \quad (5)$$

Accordingly, Vout(S) is rewritten as follows in accordance with the equations (4) and (5).

$$\begin{aligned} V_{out}(S) &= \{1/(C_S + C_x)\} \cdot \{(C_x\, I_p/S)\} \cdot (1/SC_x) \\ &= \{1/(C_S + C_x)\} \cdot (1/S) I_p \end{aligned}$$

Hence, $$V_{out}(t) = \{I_p/(C_S + C_x)\} t \quad (6)$$

As will be seen from the equation (6), the read output of each bit (element) of the contact type image sensor depends on a total value of the capacitance Cs of the capacitor 5b formed by the sensor region itself and the capacitance Cx of the capacitor 6b formed by such an attachment circuit as the wiring section. In this way, the prior art image sensor has a problem in that the sensor has an irregular read output.

SUMMARY OF THE INVENTION

It is an object of the present invention is, therefore, to provide an elongated image sensor which comprises a plurality of light receiving elements and which can suppress variations in the characteristics of the elements to prevent irregularity of a read output.

Another object of the present invention is to improve the reliability of method of fabricating an image sensor involving pollution.

A further object of the present invention is to improve the resolution of an image sensor.

Yet a further object of the present invention is to prevent increase in the power loss of a light-permeable electrode.

In accordance with an image sensor of the present invention, an overlapped region of lower and upper electrodes is set to be larger in area than a light reception region, and the light reception region areas of light receiving elements are defined to the same constant value by a light shielding means for correction of electrostatic capacitance, that is, so that a total of an electrostatic capacitance of the element itself and an electrostatic capacitance of an associated attachment circuit such as its wiring section is substantially independent of variations in the capacitances of such attachment circuits.

Preferably, the area of the overlapped region between the upper and lower electrodes is adjusted for each of the light receiving elements so that the total capacitance value of the element and attachment circuit becomes the same for all the elements.

Further, it is preferable that the area of the overlapped region between the lower and upper electrodes is set sufficiently large so that the electrostatic capacitance of the light receiving element itself is substantially much larger than that of the attachment circuit such as the wiring section, that is, so that the total capacitance value of the element and attachment circuit is substantially independent of variation in the capacitances of such attachment circuits.

When the area of the overlapped region between the upper and lower electrodes is changed, the area of a region functioning as a light receiving element (photoelectric converting section) and thus the quantity of incident light is also varied, causing a change of a photocurrent. For this reason, in the present invention, the light reception area is defined by such a light shielding means as slit to adjust the overlapped region area. More specifically, for example, when the capacitance Cs of the capacitor of the element sensor region itself is set much larger than the capacitance Cx of the capacitor of the associated attachment circuit such as the wiring section, that is, when Cs>Cx, the above equation (6) is changed to the following equation (7).

$$V_{out}(t) = \{I_P/[1 + (C_x/C_s)]\cdot C_s\}\cdot t \qquad (7)$$
$$= (I_P/C_s)\cdot t$$

It will be appreciated from the equation (7) that the output signal Vout(t) is independent of the capacitance of the attachment circuit and when the capacitance Cs of the sensor region is fixed, the output signal becomes substantially zero in variations, providing a regular output characteristic.

In accordance with another aspect of the present invention, there is provided an image sensor of a sandwich structure in which a photoconductor layer is sandwiched by a lower electrode and a light-permeable upper electrode and a light shielding film is provided within the photoconductive layer to define a light reception area.

The light shielding film may be desirably made of electrically conductive material to be used as a third electrode.

According to a method of fabricating the image sensor of the present invention, a process of forming the photoconductive layer comprises first and second steps and a step of forming the light-shielding film is added between the first and second steps.

That is, since patterning for definition of the light reception area is carried out prior to formation of a junction between the photoconductive layer and the light-permeable upper electrode, an image sensor having good characteristics can be fabricated by a simple process such as a photolitho-etching process while avoiding reduction in the sensor reliability.

Further, the definition of the light reception area is effected using such a microprocessing technique as a photolitho-etching process, whereby there can be provided an elongated image sensor which comprises light receiving elements with constant output and good accuracy.

In accordance with a further aspect of the present invention, there is provided an image sensor wherein the area of light reception region of light receiving elements is defined by providing a light shielding metal film in a predetermined region above a light permeable electrode. Formation of the metal film is carried out by a lift-off process.

More specifically, a metallic film pattern having a light impermeability and a desired shape is formed on the light-permeable electrode to define the light reception area of the elements. Therefore, formation of the light-permeable electrode requires no high dimensional accuracy. Further, even when the electrode is subjected to a damage or the like due to edge portions of a metal mask used during formation of the electrode, the damaged region will not form its light receiving region, i.e., sensor region, whereby an image sensor with a good sensor characteristic can be provided without causing any bit failure.

In addition, the metallic film pattern is coated on the light-permeable electrode to be used as an electric charge collector, which prevents the increase of power loss of the light permeable electrode.

Furthermore, formation of the metallic film pattern is performed by a lift-off process comprising a resist-pattern forming step, a metallic-film forming step and a resist-pattern forming step. As a result, the pattern formation can be effected without use of any wet etching using acid or any drug etching, or the like, with the result the sensor region will not be subjected to any deterioration during the etching process, thus realizing a reliable image sensor.

In accordance with an image sensor of the present invention, an overlapped region of lower and upper electrodes is made larger in area than a light reception region, an intermediate electrode is provided on an insulating layer formed on the lower electrode for definition of the light reception area to thereby eliminate any undesirable light signal generated outside of the necessary light receiving region, whereby only a signal of electric charges generated on the lower electrode defined by the insulating layer is used as an output of the each sensor bit.

BRIEF DESCRIPTION OF THE DRAWINGS

FIG. 9 (b) is a cross-sectional view taken along line A—A in FIG. 9 (a);

FIG. 18 (b) is a cross-sectional view taken along line A-Ax in FIG. 18 (a);

FIGS. 20 (b) and (c) are equivalent circuits when the element is subjected to no light (dark mode) and to light (bright mode), respectively.

DESCRIPTION OF THE PREFERRED EMBODIMENTS

Figure 1:
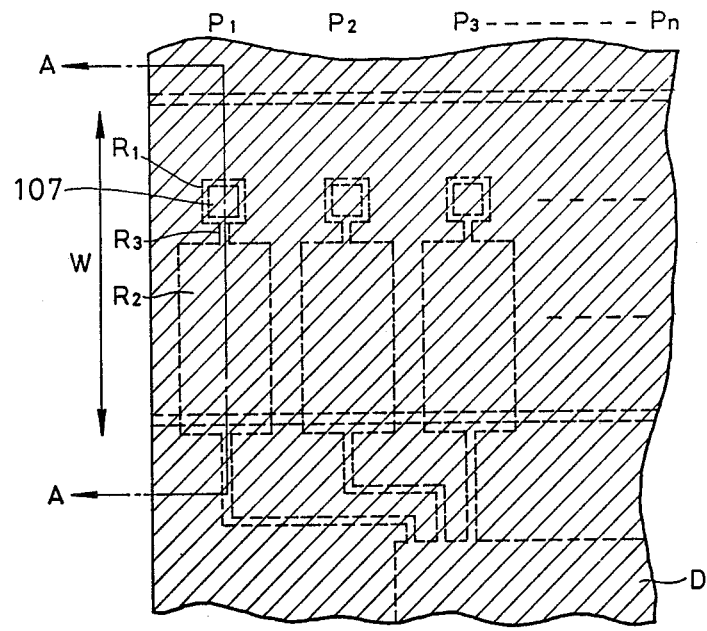
FIG. 1 is a plan view of a part of a contact type image sensor in accordance with a first embodiment of the present invention.
Figure 2:
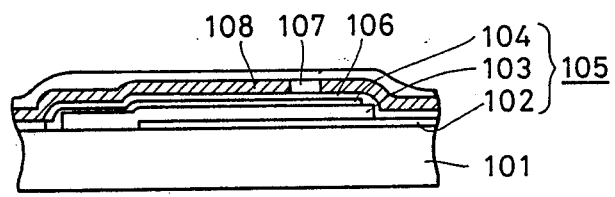
FIG. 2 is a cross-sectional view taken along line A—A in FIG. 1.

Embodiment 1:

There is shown a contact type image sensor in accordance with a first embodiment of the present invention in FIGS. 1 and 2 (FIG. 2 is a cross-sectional view taken along line A—A in FIG. 1), in which n light receiving elements P1 to Pn arranged in a row on an insulating glass substrate 101 at a density of 16 elements/mm are electrically connected to a drive section through their wiring regions formed on the glass substrate 101.

Each of the light receiving elements P1 to Pn has a photoelectric converting section 105 which comprises a lower chrome electrode 102 dividedly formed on the glass substrate 101, a photoconductive layer 103 of amorphous silicon hydride formed on the lower electrode 102 and a transparent upper electrode 104 of an indium-tin-oxide layer formed on the photoconductive layer 103. The photoelectric converting section 105 is covered with a light-permeable protective film 106 which in turn is covered with a light-impermeable film 108 having an open window 107.

The upper electrode 104 is provided integrally with the photoconductive layer 103 to form a strip so that the region of the lower electrode 102 overlapped by the integral strip has a width of 20000 $\mu m$ that is much larger than the size (50 $\mu m$ square) of the open window 107 in the light impermeable film 108, and so that the region of the lower electrode overlapped by the upper electrode is sufficiently larger in area than the wiring region connecting the each light receiving element to the drive section D.

Photosensitive gelatine formed on TPR (which is a tradename available from the Tokyo Applied Chemistry company) as the light-impermeable film 108 is dyed black except for the open window 107.

The light receiving elements P1 to Pn have electrostatic capacitances of C21 to C2n at their wiring regions which are much smaller than electrostatic capacitances of C11 to C1n at their overlapped regions (sensor regions) between the upper and lower electrodes, respectively. Accordingly, an output Vm, out(t) of the light receiving element Pm is expressed in accordance with Equation (6), as follows:

$$Vm, \text{out}(t) = \{I_p/(C1m+C2m)\}t \doteqdot \{I_p/C1m\}t$$

Figure 3:
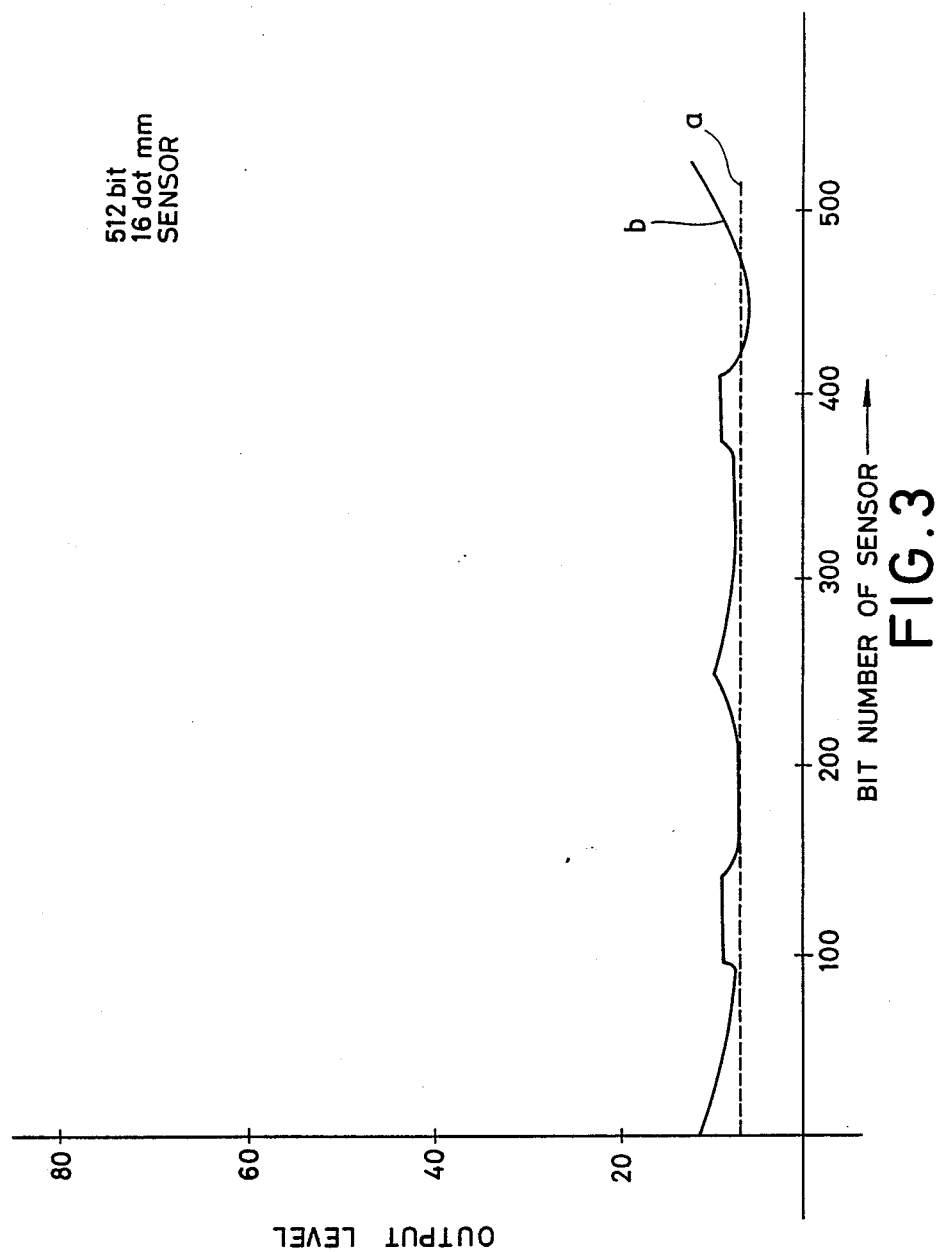
FIG. 3 shows dark output characteristics for bits of contact type image sensors of the present invention and prior art, respectively.

It has been found that the outputs of the light receiving elements P1 to Pn provide a substantially constant output as shown by a in FIG. 3 independently of the capacities C21 to C2n at the wiring regions. As seen from FIG. 3, variation in the dark output of the respective light receiving elements is as negligibly small as 5 to 10%.

A dark output characteristic of a prior-art contact type image sensor is given by b in FIG. 3 for comparison with the present invention, in which the dark output variation is between 20 and 30%. It will be appreciated from the comparison that the contact type image sensor of the present invention is made more constant in dark output characteristic than the prior art.

With such an arrangement as mentioned above, there can be provided a contact type image sensor which allows accurate reading operation while providing a non-irregular output. Further, the present invention eliminates the need for such a correction circuit as a shading correction circuit, whereby the signal processing and circuit arrangement are simplified with a low cost advantageously. Although the capacity C1m of the light receiving element and the capacity C2m of the associated wiring region have been set to satisfy a relation C1m>>C2m in the embodiment 1, the capacity correction may be made to satisfy a relation C1m+C2m=constant. In addition, since the dark output characteristic of the present invention is not affected largely by irregularities in the wiring line lengths, the invention can have design flexibility of wiring pattern.

Figure 4:
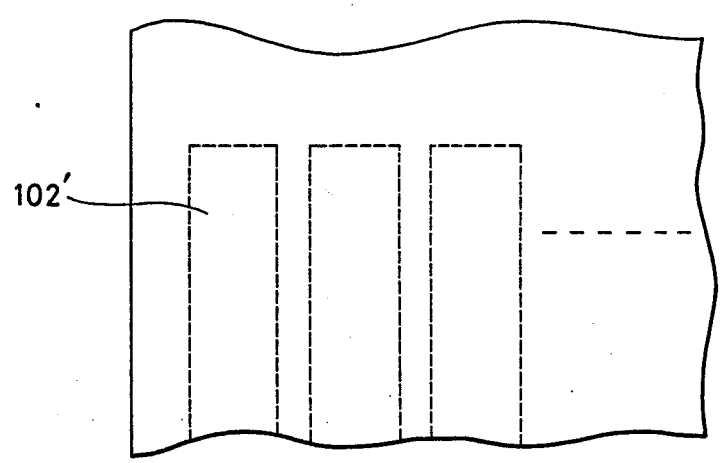
FIG. 4 is another form of a lower electrode pattern used in the present invention.

Each of the lower electrodes has comprised a square region R1 for actual light reception, a broader region R2 only for capacity formation and a narrower neck region R3 connecting the regions R1 and R2 in the embodiment 1, but the invention is not limited to the particular configuration and the each lower electrode may comprise an electrode 102' of such a strip shape as shown in FIG. 4. Further, as light shielding means, in addition to the above gelatine film, a coating of such other material as acrylic resin dyed to provide a light impermeability may be used. Also, a light shielding mask may be formed on the glass plate to be bonded on the photoelectric converting section.

The light shielding film has been made transparent to allow any-wavelength light to pass through the opening windows in the embodiment 1. However, when it is desired to obtain a colour read output, three colour (for example, red (R), green (G) and blue (B) transmissive filters may be sequentially allocated to the open windows. In formation of such filters, a gelatine film is formed, a resist pattern is formed firstly, for example, in G and B filter formation areas of the window regions in the formed gelatine film for dyeing of R, a second resist pattern is formed secondly in R and B filter formation areas of the window regions for dyeing of G, and finally a final resist pattern in formed in R and G filter formation areas of the window regions for dyeing of B. That is, the respective colour filter formation areas are dyed R, G and B respectively and regions other than the open window regions comprise three R, G and B dyed layers forming light shielding regions.

As has been disclosed in the foregoing, in accordance with the first embodiment of the present invention, the light receiving areas of the respective elements are specified to be constant by the light shielding means while the overlapped area between the lower and upper electrodes is set sufficiently large so that the electrostatic capacity of the light receiving element itself is much larger than that of its attachment circuit such as its wiring region, whereby the capacity of the element becomes independent of variations in the capacity of the attachment circuit. As a result, the present invention can provide a great flexibility to wiring pattern design with simplified signal processing.

Figure 5:
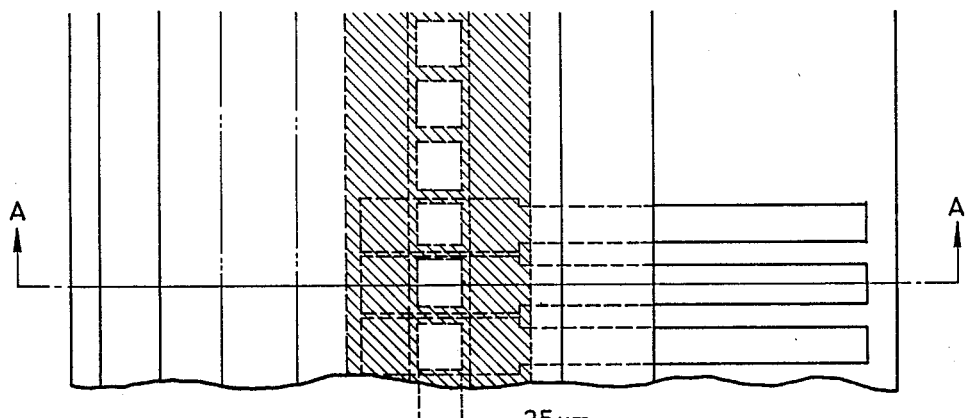
FIG. 5 is a plan view of a part of an image sensor in accordance with a second embodiment of the present invention.
Figure 6:
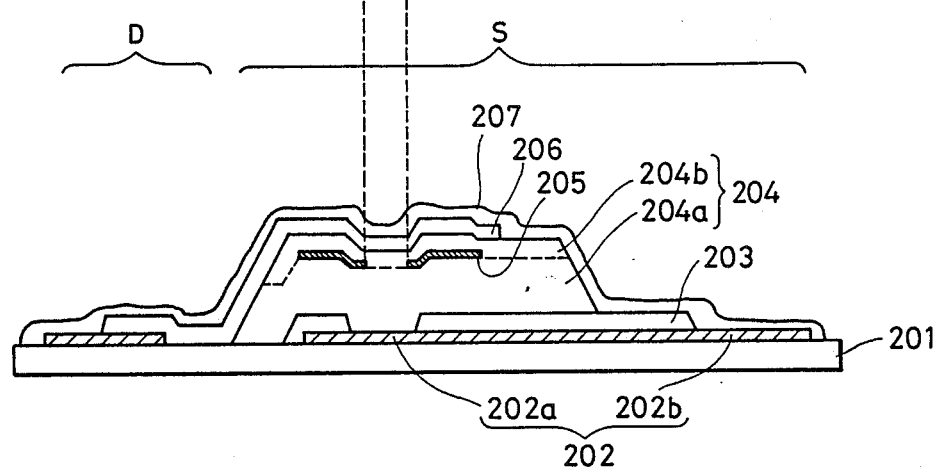
FIG. 6 is a cross-sectional view taken along line A—A in FIG. 5.

Embodiment 2:

Referring to FIGS. 5 and 6, there is shown an image sensor in accordance with the present invention having a resolution of 600 spots per inch (spi), that is, which sensor comprises photoelectric converting elements arranged on a transversely elongated substrate. More specifically, FIG. 5 shows a plan view of a part of the image sensor and FIG. 6 shows a cross-sectional view taken along line A—A in FIG. 5, in which a sensor section S comprises a lower electrode 202 having an electrode part 202a and a leading wire part 202b dividedly formed on an insulating glass substrate 201, an insulating polyimide layer 203 formed to cover the leading wire part 202b but expose the electrode part 202a, a photoconductive layer 204 of amorphous silicon hydride (a-Si:H) integrally formed on the insulating layer 203, an inner light shieldig electrode 205 of a chrome thin film provided within the photoconductive layer 204 in association with the lower electrode 202, a light-permeable upper electrode 206 of an indium tin oxide (ITO) film integrally formed on the photoconductive layer 204 in association with the lower electrode 202 and inner light shielding electrode 205, and a surface protective film 207 of polyimide formed to cover the entire surface of the substrate.

Figure 7:
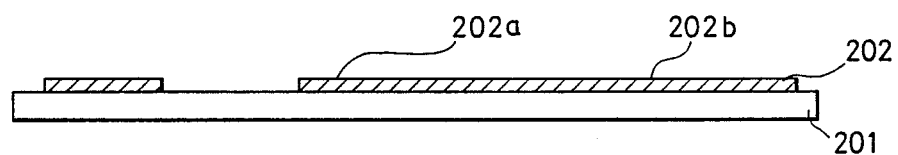
FIGS. 7 (a) to (e) are cross-sectional views for explaining a method of fabricating the same sensor.
Figure 7:
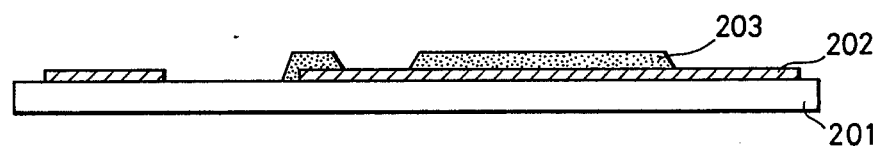
Figure 7:
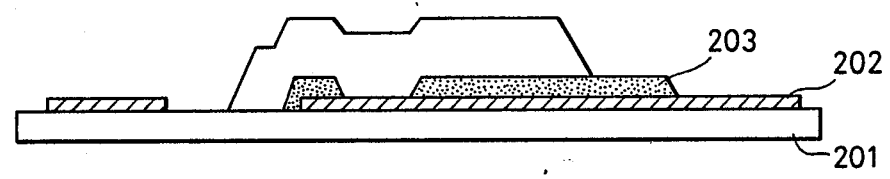
Figure 7:
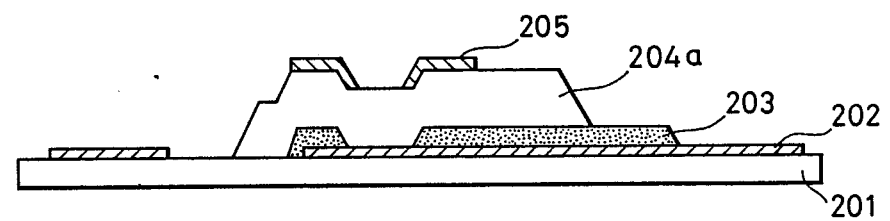
Figure 7E:
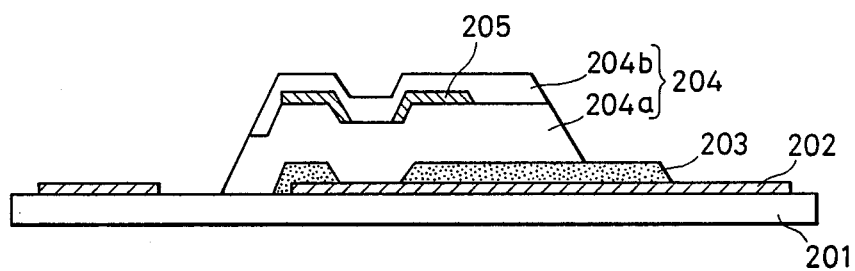

Next, description will be made as to how to fabricate the image sensor. First of all, a chrome thin film is formed on the insulating glass substrate 201 to a thickness of 2000 Å by an evaporation process at a temperature of 250° C. and subsequently is subjected to photolithoetching to form such a lower electrode 202 as shown in FIG. 7 (a). Then, as shown in FIG. 7 (b), polyimide is coated on the lower electrode 202 and dried to form the insulating film 203, and subjected by photolithoetching to patterning to specify the area of the lower electrode and to through-hole (not shown) making for multilayer wiring. Subsequently, a first amorphous silicon hydride layer 204a forming a part of the photoconductive layer is deposited to a thickness of about 1 μm by a plasma CVD process (refer to FIG. 7 (c)). The deposition temperature is set at 250° C. Next, a chrome thin film is formed to a thickness of about 500 Å at a temperature of 230° C. by the evaporation process and subjected by the photolitho-etching to patterning to form such an inner light-shielding electrode 205 as shown in FIG. 7 (d). And the resultant substrate is subjected at its surface to etching for several seconds with use of dilute (HF:HNO$_3$) to purify the surface of the first amorphous silicon hydride layer 204a and again to the plasma CVD process at a temperature of 230° C. to form a second amorphous silicon hydride layer 204b of 1000 Å thick and thus form the photoconductive layer 204, as shown in FIG. 7 (e). Finally, indium tin oxide is provided by a sputtering process to form the light permeable upper electrode 206 and then polyimide is coated on the upper electrode 206 to form the surface protective film 207, thus completing such an image sensor as shown in FIGS. 5 and 6.

With such an arrangement, the light receiving area of the photoconductive layer can be specified while providing good junction characteristics at the boundary between the photoconductive layer and the light-permeable upper electrode, the leading wire part 202b can be covered with the insulating layer provided on the lower electrode, and only the electrode part 202a can come into contact with the photoconductive layer 204 as the lower electrode 202. As a result, there can be provided an image sensor with a high resolution which can specify the light receiving area highly accurately and provide a stable characteristic without any irregularities.

According to this method, accurate prescription of the light receiving area can be achieved without performing any photolitho-etching process after formation of the surface or junction of the photoconductive layer defined by the light-permeable upper electrode, with the result of provision of an image sensor having a good sensor characteristic and a high reliability while not causing any deterioration in the junction characteristic.

Furthermore, since the surface of the first amorphous silicon hydride layer is purified through surface treatment after formation of the inner light-shielding electrode and then formed thereon with the second amorphous silicon hydride layer, the invention will not be susceptible to performance deterioration as a device.

Figure 8:
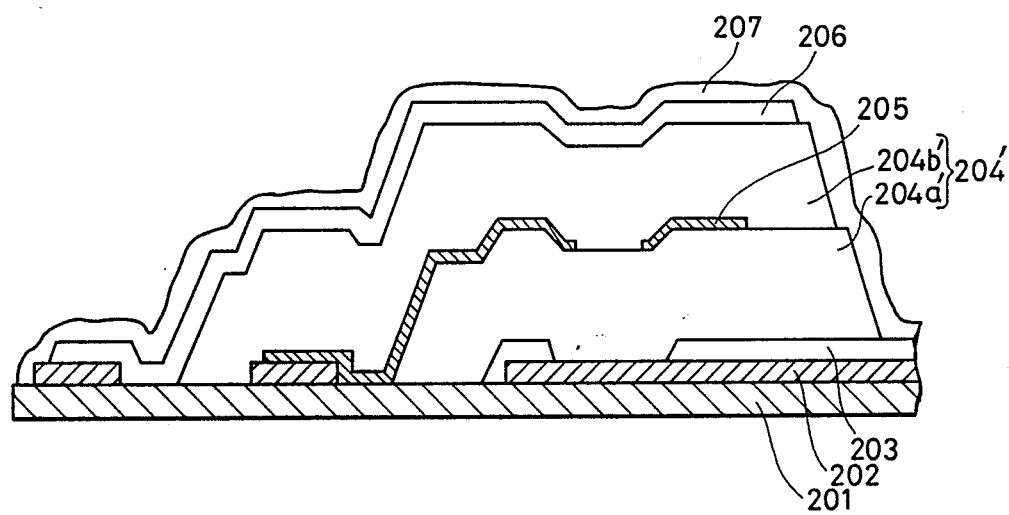
FIG. 8 is a cross-sectional view of another form of the image sensor of the second embodiment.

As an alternative of the present invention, the inner light shielding electrode 205 may be biased as shown in FIG. 8. In this case, a second amorphous silicon hydride layer 204b' is made to be about 1 μm in thickness to prevent dielectric breakdown, and other structure is exactly the same as that of FIGS. 5 and 6. In actually driving the image sensor of FIG. 8, the lower electrode, the light-permeable upper electrode and inner light-shielding electrodes are biased respectively at 0 V, −10 V and −5 V so that the potential distribution within the photoconductive layer 204' can become substantially uniform in a vertical direction. Under this condition, photo-carriers (photo-electrons) generated in a part surrounded by the inner light-shielding electrode and the upper electrode are trapped by the inner light-shielding electrode and therefore will not escape from the light shielding electrode. Thus, photo-carriers generated outside of the necessary light receiving region (outside of the prescribed light receiving area) are trapped by the inner light-shielding electrode and drift of such photo-carriers to external adjacent bits can be reliably prevented.

The position of the light-shielding electrode within the photoconductive layer, that is, the thickness ratio of the first amorphous silicon hydride layer to the second one may be appropriately changed as necessary.

The light reception area has been prescribed by forming the insulating film on the lower electrode in the foregoing embodiments, but the light area prescription may be effected by use of only an inner light-shielding film with elimination of the insulating film. In addition, though the inner light-shielding film has been made of electrically conductive material in the embodiments, it is not necessarily limited to the electrically conductive material.

As has been described in the foregoing, in accordance with the present invention, there is provided an image sensor of a sandwich structure in which the photoconductive layer of amorphous semiconductor is sandwiched by the lower electrode and the light-permeable upper electrode and the light shielding film is provided within the photoconductive layer to prescribe the light reception area. As a result, the invention can provide an image sensor having high reliability and resolution.

In accordance with the method of the present invention, since the light shielding film is formed at the intermediate stage of formation of the photoconductive layer, deterioration of the junction characteristic between the photoconductive layer and upper electrode can be remarkably suppressed, resulting in that image sensors can be fabricated highly readily with high yield and resolution.

Figure 9:
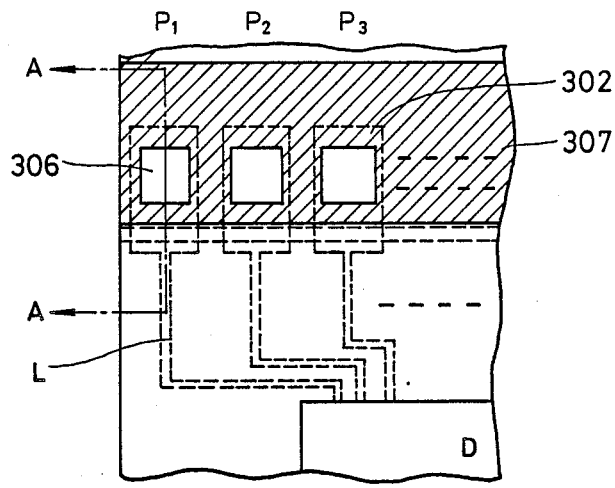
FIG. 9 (a) is a plan view of a part of a contact type image sensor in accordance with a third embodiment of the present invention.
Figure 9:
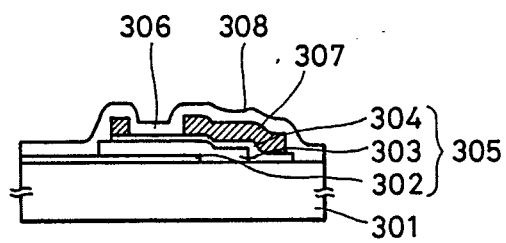

Embodiment 3:

Referring to FIGS. 9 (a) and (b), there is shown a contact type image sensor in accordance with a third embodiment of the present invention, wherein n photoelectric converting elements (light receiving elements) P1 to Pn are arranged on an insulating glass substrate 301 in a row at intervals or density of 16 dots/mm and electrically connected to the drive circuit section D through their wiring regions L formed on the glass substrate 301. FIG. 9 (b) shows a cross-sectional view taken along line A—A in FIG. 9 (a).

More specifically, each of the light receiving elements P1 to Pn has a photoelectric converting section 305 which comprises a lower chrome electrode 302 dividedly formed in a desired pattern on the glass substrate 301, a photoconductive layer 303 of amorphous silicon hydride formed on the lower electrode 302 and a light-permeable upper electrode 304 of an indium tin oxide layer. The photoelectric converting section is coated thereon with a light-shielding metal film 307 of a chrome layer having an opening 306, on which metallic film 307 a surface protective film 308 is formed.

Figure 10:
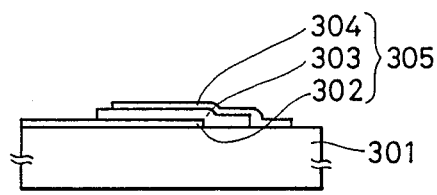
FIGS. 10 (a) to (d) are cross-sectional views for explaining a method of fabricating the same image sensor.
Figure 10:
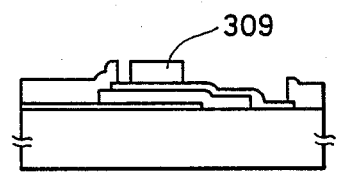
Figure 10:
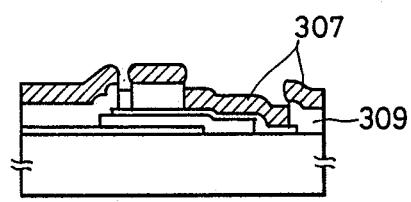
Figure 10:
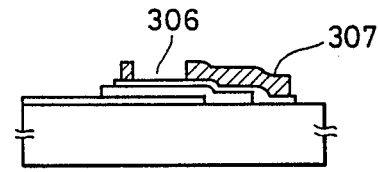

Explanation will next be made as to how to fabricate the contact type image sensor. First, a chrome thin film is formed on the insulating glass substrate 301 by the evaporation process and then subjected by the photolitho-etching process to patterning formation to form the lower electrode 302. Next, amorphous silicon hydride is deposited by a glow discharge process to form the photoconductive layer 303 on which an indium tin oxide layer as the light-permeable upper electrode 304 is formed by the sputtering process, thus completing the photoelectric converting section 305 of a sandwich structure as shown in FIG. 10 (a). In this case, it is unnecessary to define the sensor area by the upper electrode and thus formation of the amorphous silicon hydride and indium-tin-oxide film requires no high width accuracy. Accordingly, pin alignment or the like is surface for installation of a metal mask.

Subsequently, as shown in FIG. 10 (b), positive resist called OFPR800 and available from the Tokyo Applied Chemistry company coated and selectively removed by a photoetching process at a region corresponding to the light-shielding metal film 307 to form the resist pattern 309.

Next, as shown in FIG. 10 (c), chrome is formed to a thickness of 1000 A by an electron beam evaporation process at a room temperature of 120° C. to form a light shielding metal film 307.

Finally, the resultant substrate is ultrasonically purified or cleaned with acetone, bytyl acetate+isopropyl alcohol (IPA), ethanol, or the like to release the resist pattern, thus forming a contact type image sensor having the light-shielding metal film 307 as shown in FIG. 10 (d). And then the thus-obtained sensor is further coated thereon with the surface protective film 308, such a contact type image sensor as shown in FIG. 9 (a) and (b) is completed.

In the thus-contained contact type image sensor, the photoelectric converting section 305 is coated with the light-permeable metal film 307 and the sensor area is defined by the opening 306 of the metal film 307 so that when edge portions of the metal film may provide damage to the primary or ground amorphous silicon hydride layer during formation of the light-permeable upper electrode, the damaged part will not work as a sensor, resulting in that the image sensor can provide a good sensor characteristics without causing any defective bits.

Further, since the light-shielding metal film 307 acts as a carrier collector, the image sensor can be reduced in power loss and the light-permeable upper electrode can be made thin while increasing the light permeability.

Furthermore, use of a lift-off method in patterning of the light-shielding metal film 307 enables elimination of the metal etching process and requires only the resist releasing process by acetone washing or the like, whereby the sensor characteristic can be kept good.

Although the light shielding metal film has been made of chrome in the embodiments, the present invention is not limited to chrome and other metals such as aluminum (Al), platinum (Pt), indium (In), tin (Sn), gold (Au) silver (Ag) or Molybdenum (Mo) may be used.

The resist used in the lift-off process to form the light-shielding metal film pattern is not limited to OFPR800 and other resist such an Az861, Az1350J (manufactured by the Hext Company) may be employed. However, it is desirable to use positive resist because of its good releasability.

Figure 11:
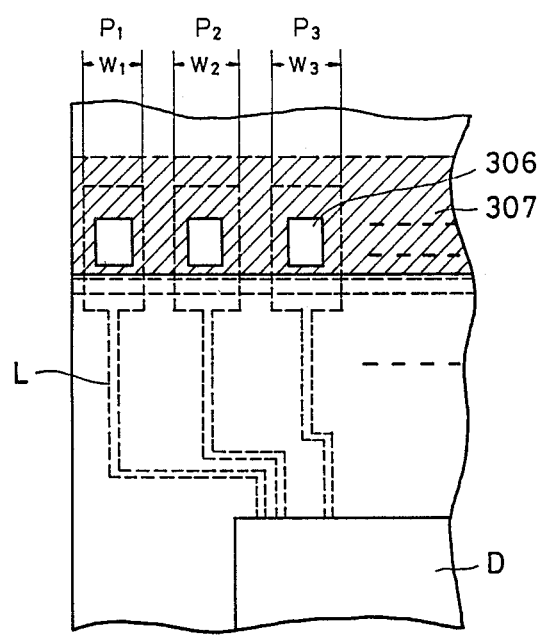
FIG. 11 is another form of the image sensor of FIG. 9 (a)

Furthermore, the patterns of the lower electrodes 302 have been made the same for the respective light receiving elements P1 to Pn in the embodiments. However, as shown in FIG. 11, the widths W of the lower electrodes 302 may be varied to be W1, W2, ... and Wn (W1 W2 W3 ...) respectively so that variations in the electrostatic capacities of the sensor elements resulting from the lower electrodes having different widths enables the correction of variations in the electrostatic capacities of the related attachment circuits resulting from different lengths of related leading wires L. As a result, a good contact type image sensor having regular inter-bit characteristics can be obtained.

As has been disclosed in the foregoing, the present invention can provide a contact type image sensor which provides a less electrode power loss, not defective bits and a good sensor characteristic, since the light-shielding metal film is formed on the light receiving elements of sandwich structure to define the sensor area.

Formation of the light-shielding metal film uses the lift-off process, so that a reliable contact type image sensor can be fabricated without causing any deterioration of the characteristic about the junction between the indium tin oxide ground film and amorphous silicon hydride layer.

Figure 12:
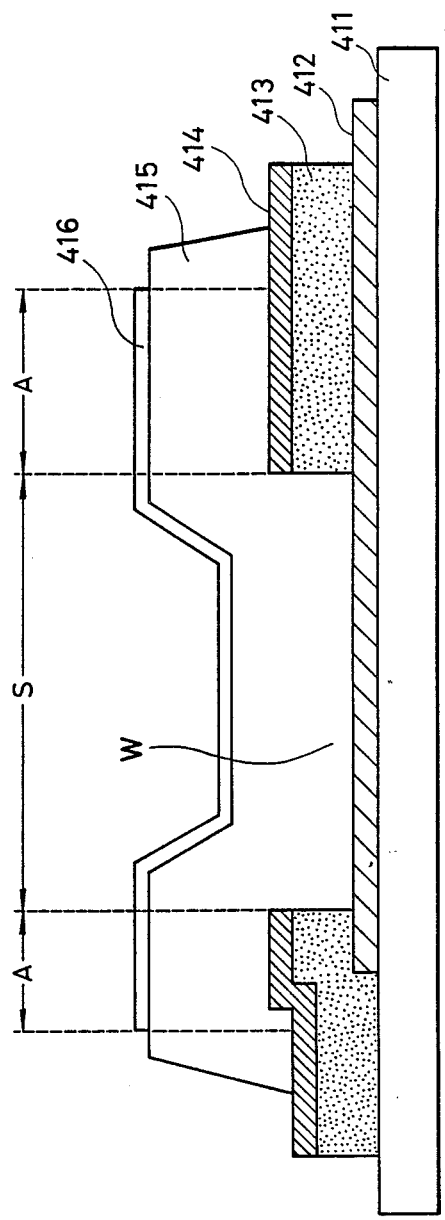
FIG. 12 is a cross-sectional view showing a basic structure of an image sensor in accordance with a fourth embodiment of the present invention.

Embodiment 4:

An image sensor according to a fourth embodiment of the present invention, as shown in FIG. 12, comprises a lower electrode 412 dividedly formed in a desired pattern on a substrate 411, an insulating film 413 having an opening W and formed on the lower electrode to define the sensor surface or area, an intermediate electrode 414 formed on the insulating film 413, a photoconductive layer 415 and an upper electrode 416. Actually, only the opening W region defined by the insulating film 413 has a sandwich structure in which the photoconductive layer is sandwiched by the lower and upper electrodes, and in the other region, the presence of the intermediate electrode prevents a signal of electric charges generated on the insulating film from moving into the lower electrode.

This structure becomes more effective in a storage mode, that is, when photo-carriers generated within the photoconductive layer by incident light causes discharge of electric charges stored between the upper and lower electrodes to detect the amount of such incident light.

Figure 13:
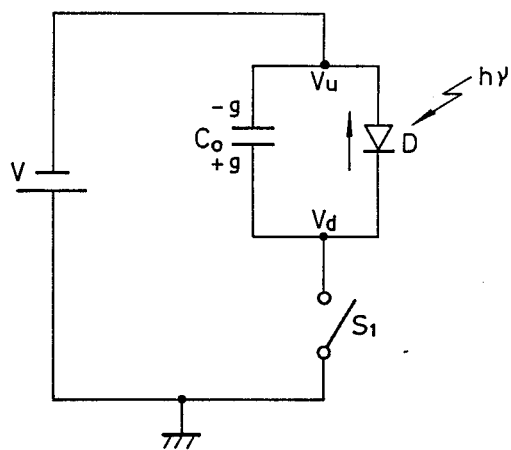
FIGS. 13 to 15 are equivalent circuits for explaining the operation of the same image sensor.

The actual operation is as follows. First, a voltage V is applied between the upper and lower electrodes so that the lower electrode is at the ground potential and the upper electrode is at a minus potential, whereby the sandwich type sensor is charged. At this time, electric charge q is stored in the sensor capacitance Co. Then when the potential of the upper electrode is kept and the lower electrode is opened to be released from the ground potential, the image sensor has such an ideal equivalent circuit as shown in FIG. 13 in which a switch S1 is in its opened state, photocarriers generated by incident light causes electric charges stored in the capacitance Co to be discharged so that the potential Vd of the lower electrode approaches the potential Vu of the upper electrode gradually with time. A change rate $\Delta Vd$ of the lower electrode potential Vd is detected because the change rate is proportional to the quantity of incident light.

Figure 14:
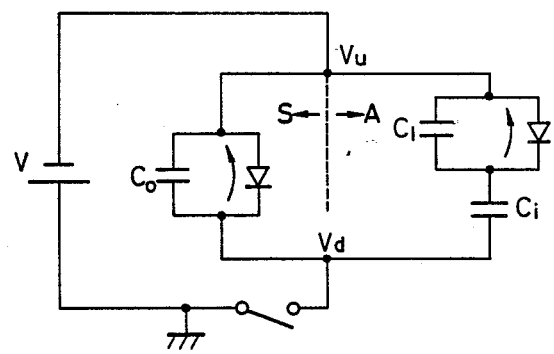

However, the image sensor has such an actual equivalent circuit as shown in FIG. 14 which, in addition to the capacitance Co of the defined sensor section S, has the capacitance component CI of the sandwich type sensor formed in the region A coated the insulating film by the intermediate and upper electrodes 414 and 416 and photoconductive layer 415 as well as a composite capacitance Ci of the region under the insulating film.

Figure 15:
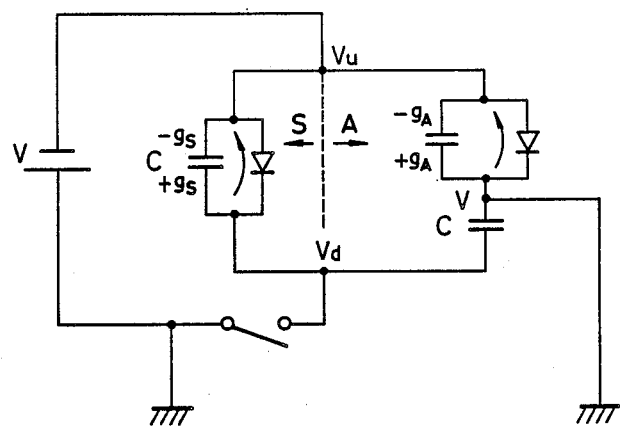

Thus, when the intermediate electrode is grounded at the ground potential, the image sensor has such an equivalent circuit as shown in FIG. 15, that is, a point Va is always at zero potential which is not affected completely by electric charges generated at the region A. Therefore, the potential Vd varies with only the electric charges generated at the region S. With this arrangement, since a changed electric charge is stored in the composite capacitance Ci of the region under the insulating film, the potential Vd of the lower electrode can be arbitrarily changed by properly setting the capacitance Ci.

In this way, it becomes possible to detect only the electric charges generated in the sensor surface.

Figure 16:
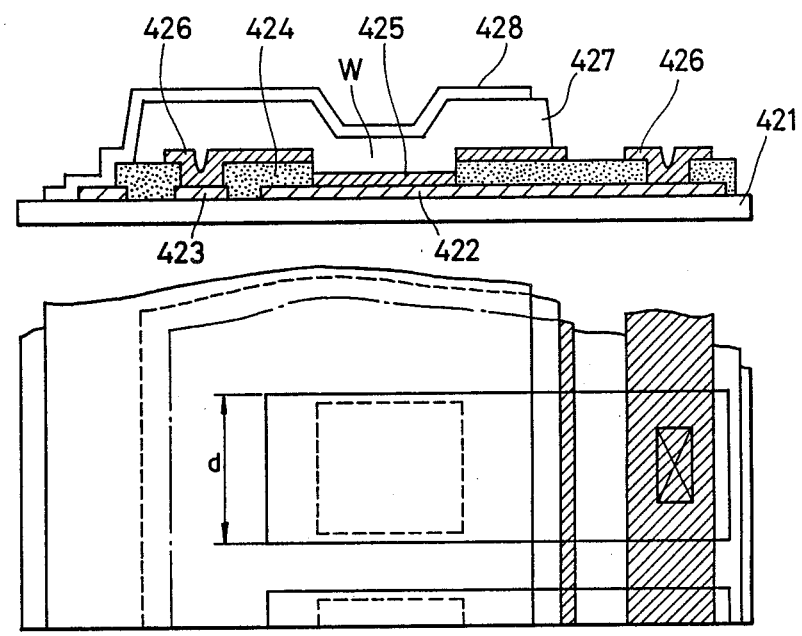
FIG. 16 shows a contact type image sensor in accordance with an embodiment of the present invention.

Embodiment 5:

Referring to FIG. 16, there is shown a contact type image sensor in accordance with a fifth embodiment of the present invention, which sensor comprises light receiving elements P1 to Pn arranged at a pitch of 16 elements/mm on a glass substrate 421. Each of said light receiving elements comprises a lower electrode 422 and a first wiring layer 423 of a chrome thin film formed in a desired pattern on the substrate 421, an insulating film 424 of polyimide formed on the lower electrode and provided therein with a square opening W having equal sides of each d long, an intermediate electrode 425 and a second wiring layer 426 of a second chrome thin film formed in a desired pattern on the insulating film, a photoconductive layer 427 of amorphous silicon formed on the intermediate electrode 425, and a light-permeable upper electrode 428 of an indium tin oxide. The effective light reception region is defined by the opening W provided in the insulating film and intermediate electrode.

When the arrangement pitch of the light receiving elements is 16 elements/mm and the pitch of the sensor bits is 62.5 $\mu$m, the effective light reception region is set to have a side length d of 50 um and an area of 2500 um$^2$.

Figure 17:
FIGS. 17 (a) to (d) are cross-sectional views for explaining a method of fabricating the same image sensor.
Figure 17:
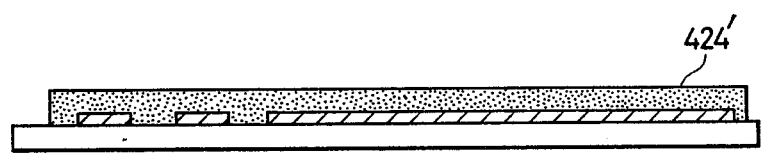
Figure 17:
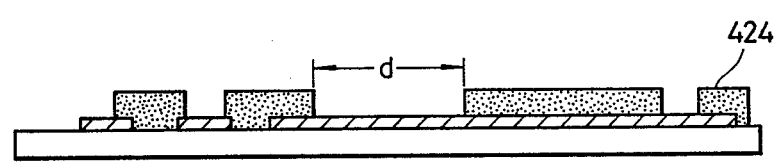
Figure 17:
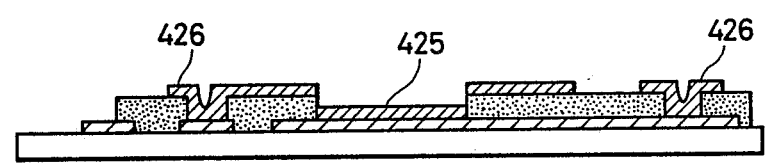
Figure 18:
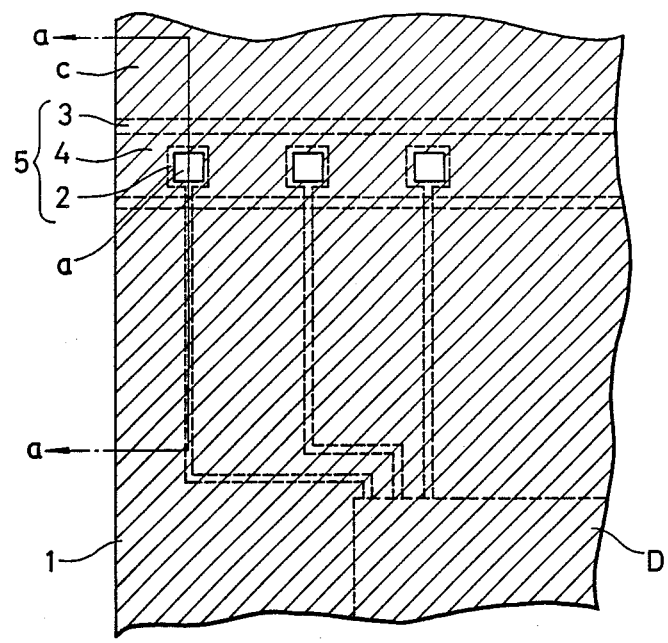
FIG. 18 (a) is a plan view of a part of a prior-art contact type image sensor.
Figure 18:
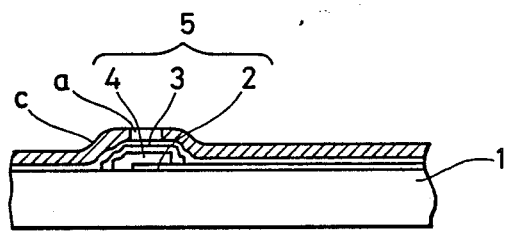
Figure 19:
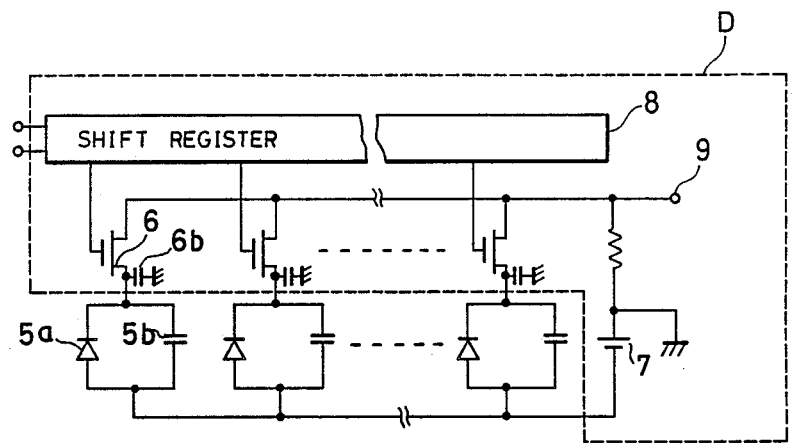
FIG. 19 is an equivalent circuit of the prior art image sensor.
Figures 20A, 20B, 20C:
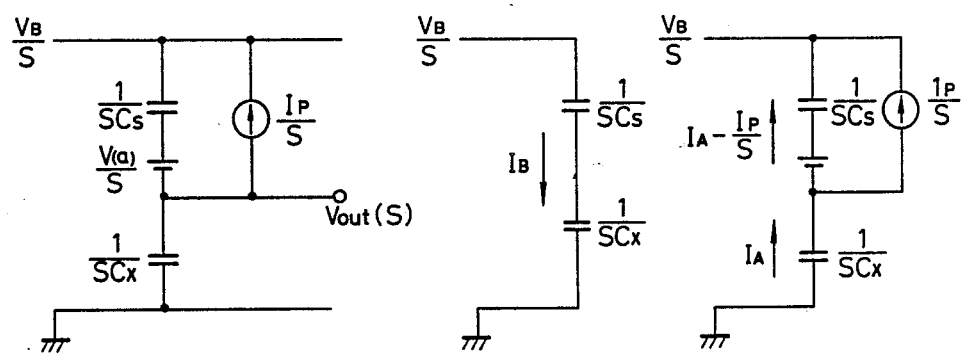
FIG. 20 (a) is an equivalent circuit of one of light receiving elements in FIG. 19.

Next, explanation will be directed to how to fabricate the contact type image sensor. First, as shown in FIG. 17 (a), chrome thin film of 3000 Å thick is formed on the glass substrate 421 by a vacuum evaporation process and then subjected by the photolitho-etching process to patterning to form the lower electrode 422 and the first wiring layer 423. Then, as shown in FIG. 17 (b), a polyimide film 424' of 1 um thick is formed on the lower electrode 422 and first wiring layer 423 by a spin coating process. As shown in FIG. 17 (c), polyimide film 424' is patterned by the photolitho-etching process to form the insulating film 424 positioned on the lower electrode and having the opening W having sides of each d long. A second chrome thin film of 3000 Å is again formed on the insulating film 424 by the vacuum evaporation process and then patterned by the photolitho-etching process to form the intermediate electrode 425 and second wiring layer 426, as shown in FIG. 17 (d). Subsequently, amorphous silicon is deposited to a thickness of 1 um by the known glow discharge process to form the photoconductive layer 427. Then, formed on the photoconductive layer 427 by the sputtering process is an indium tin oxide film of 1000 Å thick to form the upper electrode 428. In the both processes, a metal mask is used for selective film formation.

The thus-fabricated contact type image sensor provides high resolution and reliability because provision of the intermediate electrode enables elimination of leakage of a photo signal into unnecessary light reception regions and thus prevention of adjacent bit failure.

Further, since the sensor area is defined prior to formation of the photoconductive and upper electrode layers as important parts of the sensor, the respective layers can be prevented from deterioration and a high reliability can be maintained.

In addition, it is unnecessary to form a light shielding film and thus the fabricating process becomes highly simple.

Although the effective light reception region is defined by the d-square opening, the area of the effective light reception region becomes actually less than $d^2$ because different electric fields (potential distribution) take place in the vicinity of the opening of the intermediate electrode according to a voltage applied to the intermediate electrode and to a potential difference between the upper and lower electrodes. However, the resolution performance requirement of the sensor demands that the size of the light reception region must not exceed the pitch (in this embodiment, 62.5 µm) and thus performance deterioration will not practically occur.

The patterning of the insulating film and intermediate electrode has been carried out by separate processes in the embodiment, but the processes can be eliminated for such a sensor structure as requiring no multi-layer wiring section. In this connection, polyimide insulating film may be locally formed with an accuracy of 0 to 1 mm by screen printing or like process, the intermediate electrode may be selectively deposited and then patterned by the photolitho-etching process, the pattern may be used as a mask to remove the insulating film by etching, and then openings may be made on self-alignment basis. According to this method, the number of photolitho-etching processes can be reduced by one.

Furthermore, the intermediate electrode can restrict the quantity of incident light and define the effective light reception region and at the same time form an electrostatic capacity between the intermediate and ground lower electrodes, said capacity being proportional to the overlapped area of the electrodes. Therefore, by adjusting the pattern configuration, the wiring stray capacity distribution can be corrected.

In addition, though the insulating film has been made of polyimide in the embodiment, it goes without saying that the film may be made of other organic insulating material or other inorganic insulating material such as silicon nitride or silicon oxide. However, among such organic and inorganic insulating materials, ones having heat and chemical resistance are desirable selected.

In accordance with the present invention, the intermediate electrode is provided on the insulating layer formed on the lower electrode to define the light reception area and only a signal of electric charges generated on the lower electrode defined by the insulating layer is outputted as an output of the each sensor bit. As a result, there can be provided a reliable image sensor which can detect only the electric charges generated on the sensor surface and prevent any leakage current into adjacent bits.

Since the present invention can eliminate the need for formation of any light shielding film and also define the light reception area prior to formation of the photoconductive layer and upper electrode, the invention can provide an image sensor which can be easily fabricated while not causing any deterioration with good sensor characteristics.

What is claimed is:
1. An image sensor comprising:
   a substrate;
   a plurality of light receiving elements of a sandwich type juxtaposed with each other on said substrate, each of said light receiving elements including a lower electrode, a photoconductive layer disposed over said lower electrode and an upper electrode disposed over said photoconductive layer, one of said lower electrode and said upper electrode being light permeable, said lower electrode, said photoconductive layer and said upper electrode partially overlapping each other to form an overlapped region for each of said light receiving elements, said overlapped region having an area and a capacitance whose magnitude is determined in accordance with the area;
   light shielding means disposed to cover said overlapped region for each of said light receiving elements and formed with a plurality of windows of a predetermined size for allowing light to enter a part of said overlapped region;
   driving means for driving said light receiving elements;
   a plurality of connecting sections formed on said substrate, each of said connecting sections having a length and a capacitance whose magnitude is determined in accordance with the length connecting each of said light receiving elements to said driving means; and
   wherein the area of the overlapped region for each of said light receiving elements is determined such that the sum of the capacitance of said overlapped region for one of said light receiving elements and the capacitance of the one of said connecting sections associated with the overlapped region for said one of said light receiving elements is made equal to the sum of the capacitance of said overlapped region for another one of said light receiving elements and the capacitance of another one of said connecting sections associated with the overlapped region for said another one of said light receiving elements.

2. An image sensor as set forth in claim 1, wherein said overlapped region is made large in area so that said capacitance of said overlapped region is substantially larger than that of said connecting sections.

3. An image sensor as set forth in claim 2, wherein said lower electrode comprises divided electrodes formed mutually independently, said upper electrode comprises a strip-shaped light permeable electrode integrally formed all over said light receiving elements, and said light-permeable strip electrode is substantially larger in width than said windows.

4. An image sensor as set forth in claim 2 or 3, wherein said light shielding means comprises a light shielding filter made of a gelatine film formed on said light receiving elements.

5. An image sensor as set forth in claim 2 or 3, wherein said light shielding means comprises a light shielding filter made of a dyeable polymer formed on said light receiving elements.

6. An image sensor as set forth in claim 2 or 3, wherein said light shielding means comprises a plate-shaped light-shielding filter provided on said light receiving elements.

7. An image sensor as set forth in claim 1, wherein said upper electrode is a light permeable electrode and said light shielding means is a light-shielding metallic film selectively formed on said light permeable upper electrode.

8. An image sensor comprising a sandwich structure wherein a photoconductive layer is sandwiched by a lower electrode and a light permeable upper electrode, wherein said photoconductive layer comprises a lower layer and an upper layer, and a light shielding film is interposed between said upper and lower layers to define a light reception area.

9. An image sensor as set forth in claim 8, wherein said light shielding film comprises an inner light-shielding electrode made of electrically conductive material.

10. An image sensor as set forth in claim 8 or 9, wherein said photoconductive layer comprises an amorphous silicon layer.

11. An image sensor of a sandwich type comprising:
a plurality of light receiving elements arranged on a substrate, said elements each comprising a lower electrode dividedly formed in a desired configuration on said substrate, a photoconductive layer and a light-permeable upper electrode,
an insulating film having an opening therein provided on said lower electrode to define a light reception area, and
an intermediate electrode provided on said insulating film, and applied with a predetermined electric potential.

12. An image sensor as set forth in claim 11, wherein said intermediate electrode is electrically isolated from said lower electrode.

13. An image sensor as set forth in claim 11, wherein said insulating film is made or organic insulating material as polyimide.

14. An image sensor as set forth in claim 11, wherein said insulating film is made of such inorganic insulating material as silicon nitride or silicon dioxide.

15. An image sensor comprising:
a substrate;
a plurality of light receiving elements of a sandwich type juxtaposed with each other on said substrate, each of said light receiving elements including a light-receiving lower electrode, a photoconductive layer disposed over said lower electrode, and a light permeable upper electrode disposed over said photoconductive layer, said photoconductive layer and said upper electrode partially overlapping each other to form an overlapped region for each of said light receiving elements, said overlapped region having an area and a capacitance whose magnitude is determined in accordance with the area;
light shielding means disposed to cover said overlapped region for each of said light receiving elements and formed with a plurality of windows of a predetermined size for allowing light to enter a part of said overlapped region;
driving means for driving said light receiving elements;
a plurality of connecting sections formed on said substrate, each of said connecting sections having a length and a capacitance whose magnitude is determined in accordance with the length connecting each of said light receiving elements to said driving means,
wherein the area of the overlapped region for each of said light receiving elements is determined such that the sum of the capacitance of said overlapped region for one of said light receiving elements and the capacitance of the one of said connecting sections associated with the overlapped region for said one of said light receiving elements is made equal to the sum of the capacitance of said overlapped region for another one of said light receiving elements and the capacitance of another one of said connecting sections associated with the overlapped region for said another one of said light receiving elements.

16. An image sensor as set forth in claim 15, wherein said overlapped region is made large in area so that said capacitance of said overlapped region is substantially larger than that of said connecting sections.

17. An image sensor as set forth in claim 16, wherein said lower electrode comprises divided electrodes formed mutually independently, said upper electrode comprises a strip-shaped light permeable electrode integrally formed over said light receiving elements, and said light-permeable strip electrode is substantially larger in width than said windows.

18. An image sensor as set forth in claim 15, wherein said light shielding means is a light-shielding metallic film selectively formed over said light permeable upper electrode.

* * * * *